United States Patent [19]

Cheung et al.

[11] Patent Number: 5,354,386

[45] Date of Patent: Oct. 11, 1994

[54] METHOD FOR PLASMA ETCHING TAPERED AND STEPPED VIAS

[75] Inventors: David W. Cheung, Foster City; Norman E. Abt, Burlingame, both of Calif.; Peter A. McNally, Austin, Tex.

[73] Assignee: National Semiconductor Corporation, Santa Clara, Calif.

[21] Appl. No.: 328,179

[22] Filed: Mar. 24, 1989

[51] Int. Cl.$^5$ ................ H01L 29/12; H01L 21/00; H01L 21/02
[52] U.S. Cl. .................. 148/33.3; 437/225; 437/228; 156/653
[58] Field of Search ............. 148/33.3, DIG. 51; 437/225, 228, 235, 238; 156/643, 644, 651, 652, 653; 204/192.32, 192.35, 192.37

[56] References Cited

U.S. PATENT DOCUMENTS 4,451,326 5/1984 Gwozdz ............... 156/644
4,698,132 10/1987 Dennis ................ 156/644

FOREIGN PATENT DOCUMENTS 268021  5/1988  European Pat. Off. ..... H01L 21/31
0130426 7/1984  Japan .
0293230 10/1992 Japan .................. 437/225

OTHER PUBLICATIONS

Coburn, J., Plasma-Assisted Etching, Plasma Chem. and Plasma Process, vol. 2, No. 1, 1982, pp. 1–7.
T. A. Bartush, J. J. Colacino & G. S. Gati, "Sidewall Tailoring Using Two Different Reactive Ion Etchants in Succession," *IBM Technical Disclosure Bulletin*, vol. 20, No. 4, Sep. 1977.
"Sidewall Tailoring Using Two Different Reactive Ion Etchants In Succession," T. A. Bartush, J. J. Colacino and G. S. Gati, IBM Technical Bulletin, vol. 20, No. 4, dated Sep. 1977 (one page).

*Primary Examiner*—R. Bruce Breneman
*Assistant Examiner*—B. Everhart
*Attorney, Agent, or Firm*—Limbach & Limbach

[57] ABSTRACT

A multi-step plasma etch method for etching a tapered via having uniform bottom diameter ("CD") and extending through the resist and into the oxide layer of a coated semiconductor substrate, and a coated semiconductor substrate whose coating has been plasma etched to define such a tapered via. The first step of the inventive method is an anisotropic oxide plasma etch operation, preferably employing a plasma consisting primarily of $CF_4$, which produces a non-tapered via having diameter substantially equal to CD and extending through the resist and into the oxide layer. A preferred embodiment of the inventive method includes a second step defining an upper sloping via portion without significantly increasing the diameter of a lower portion of the non-tapered via. This second step is a tapered resist plasma etch operation employing a mixture of oxygen ($O_2$) and $CF_4$. The slope of the upper sloping via portion may be controlled by varying the ratio of oxygen to $CF_4$. In an alternative embodiment, the method produces a "stepped" via having an upper non-tapered portion which extends through the resist and has an opening diameter substantially greater than CD, and a lower non-tapered portion which extends through the oxide and has diameter substantially equal to CD.

1 Claim, 3 Drawing Sheets

METHOD FOR PLASMA ETCHING TAPERED AND STEPPED VIAS

FIELD OF THE INVENTION

The invention is a method for etching a coated semiconductor substrate to define a tapered via, and a coated semiconductor substrate whose coating has been etched to define such a tapered via. More particularly, the invention is a method for defining a tapered via by plasma etching the coating of a coated semiconductor substrate (such as a semiconductor wafer used in an integrated electronic circuit manufacturing process), and a coated semiconductor substrate whose coating has been plasma etched to define such a tapered via.

BACKGROUND OF THE INVENTION

In conventional integrated circuit manufacturing processes, wafers comprising a semiconductor substrate (typically silicon) having a metal pattern deposited thereon are first coated with an oxide layer. A layer known as a "resist" is then coated on the oxide layer. In order to deposit conductive material directly onto a region of the substrate, or onto a region of the metal pattern deposited on the substrate, the oxide and resist layers above such region must be removed. The channel through the oxide and resist layers formed by such removal is known as a "via." Various conventional etching processes have been employed to produce vias.

For example, a conventional anisotropic plasma etch process produces vias having sidewalls substantially perpendicular to the plane of the resist and oxide layers ("non-tapered" vias). Such non-tapered vias are produced in this process by exposing a coated wafer to an oxide etch plasma, typically consisting of $CHF_3$, $C_2F_6$, or a $CHF_3/C_2F_6$ mixture. Such fluorocarbons are often used as the oxide etch substance since they are "selective" to silicon in the sense that they will not erode silicon over a characteristic time period in which they will erode the resist and oxide layers coated on a silicon substrate.

However, poor metal coverage typically results when metal is deposited in the non-tapered vias produced by such conventional processes. This phenomenon can be explained by recognizing that in a typical metal deposition process, the metal coverage is limited by the amount of metal arriving to the inside of the via through the via opening and by the ability of the metal to distribute evenly on the vertical (non-tapered) via sidewalls. We have found that when a metal film consisting of a TiW/Al/TiW sandwich is sputtered in a conventional manner inside a conventional cylindrical via having 1.0 micron depth and 1.5 micron diameter, the resulting metal coverage on the via sidewalls is often less than twenty percent.

One technique that has been tried for improving metal coverage on the sidewalls is to produce a via whose sidewalls have a tapered profile. Such a tapered profile via can be produced by employing a conventional resist erosion plasma etch process. In such a resist etch process, the resist and the oxide layer are simultaneously eroded (with a fixed ratio of vertical etching rate to lateral etching rate) by exposure to a plasma consisting of a mixture of oxygen and an oxide etch substance such as $CHF_3$, $C_2F_6$, or a $CHF_3/C_2F_6$ mixture. Given a selected mixture of oxide etch substance and oxygen, the slope of the via sidewalls produced in such process is fixed. Thus, variations in the resist or oxide layer thickness (or in the thickness of metal deposits or other topographic features on the semiconductor substrate) will vary the bottom diameter (also referred to as the critical dimension or "CD") of the vias produced by such process, in a manner that will be readily appreciated with reference to FIG. 1.

Three vias (identified by numerals 41, 42, and 43) of the type produced by a conventional resist erosion plasma etch process are shown in FIG. 1. FIG. 1 is a cross-sectional view of semiconductor substrate 10, which is coated by oxide layer 20 and resist 30. Metal portion 14 is deposited on substrate 10, and metal portion 15 is deposited on topographic feature 16 on substrate 10. Since the plane of FIG. 1 is perpendicular to the planar interface between substrate 10 and oxide layer 20, the cross-section of each of vias 41, 42, and 43 is shown in FIG. 1. Vias 41, 42, and 43 may be frustoconical or conical, or may be laterally elongated with a longitudinal axis perpendicular to the plane of FIG. 1. Vias 41, 42, and 43 have been produced by exposing layers 20 and 30 above metal portion 15, metal portion 16, and region 17 on the surface of substrate 10, respectively, to the resist etching plasma for the same time period. The critical dimension (or "CD") of via 41 extending to metal portion 14 has magnitude A, which is less than the CD (having magnitude B) of via 42 extending to metal portion 15. Due to an increased thickness of oxide 20 above region 17, via 43 above region 17 does not extend all the way to region 17, so that via 43 would need to be etched for an additional time period (i.e. would need to be "overetched") in order to reach substrate 10. However, if via 43 were overetched for a sufficient time duration so that it reached region 17, the diameter of the portion of such overetched version of via 43 farthest from substrate 10 (the diameter of the "opening" of overetched via 43) would undesirably be far greater than the opening diameter (length C) of via 41 or 42.

Improved metal coverage can alternatively be achieved by using conventional wet etch processes or sequential dry and wet etch processes. Two vias of the type produced by this class of process are shown in FIG. 2. The liquid chemicals (typically acids) employed in wet etching will erode unimaged portions of the resist (indicated by dashed resist portions 34 and 35) but will not react with imaged portions of the resist such as resist portions 31, 32, and 33. The wet etching process will accordingly undercut an imaged resist portion such as portion 31 if allowed to proceed for a sufficiently long time. More generally, because wet etching is an isotropic etching process (i.e., the vertical and lateral etching rates are substantially the same), wet etching is unsuitable for etching vias having high aspect ratio, where the phrase "aspect ratio" denotes the ratio of via depth (i.e., "vertical" extent in the direction perpendicular to the plane of the semiconductor substrate) to via lateral dimension.

It has not been known until the present invention how to produce vias by a plasma etching process in a manner eliminating both the above-described problems of poor metal coverage and CD variation. Nor has it been known until the present invention how to eliminate both the problem of poor metal coverage and the problem of CD variation in a process for etching high aspect ratio vias.

SUMMARY OF THE INVENTION

The method of the invention is a multi-step plasma etch method for producing a tapered via having a uniform bottom diameter ("CD") notwithstanding variations in resist or oxide layer thickness and variations in the thickness of metal deposits or other topographic features on the semiconductor substrate. The semiconductor substrate of the invention includes a coating has been plasma etched to define such a tapered via. In each of its embodiments, the first step of the inventive method is an anisotropic oxide plasma etch operation which produces a non-tapered via extending through the resist and into the oxide layer and having diameter substantially equal to CD. In a preferred embodiment, the plasma employed in this operation consists primarily of $CF_4$, rather than other known etchants such as $CHF_3$, $C_2F_6$, or a $CHF_3/C_2F_6$ mixture.

One three-step embodiment of the inventive method produces a "stepped" via having an upper non-tapered portion which extends through the resist and has an opening diameter substantially larger than CD, and a lower non-tapered portion which extends into the oxide and has a diameter substantially equal to CD. The second step of this embodiment is an isotropic resist plasma etch operation which increases the diameter of the upper via portion extending through the resist, but does not significantly enlarge the lower via portion extending into the oxide layer. The third step of this embodiment is an anisotropic oxide plasma etch operation which uses a $CF_4$ plasma to erode the lower via portion extending into the oxide layer, and which may also increase the via depth to the desired total depth. Preferably, the plasma used in the second step consists of substantially only $O_2$.

A preferred two-step embodiment of the invention is a method for producing a via having an upper tapered portion and a lower non-tapered portion. The second step of this embodiment is a resist erosion tapered plasma etch operation which erodes both the resist and the oxide layer, but is controlled so as to produce a via having a non-tapered lower portion, and an upper portion with a sloping profile. A plasma including a mixture of oxygen ($O_2$) and $CF_4$ is employed during the second step to etch the resist and oxide simultaneously. The slope of the via's upper sloping portion may be controlled by varying the ratio of oxygen to $CF_4$ employed by the second step, and the depth to which the sloping portion extends is determined by the duration of the second step.

DETAILED DESCRIPTION OF THE PREFERRED EMBODIMENTS

Figure 1:
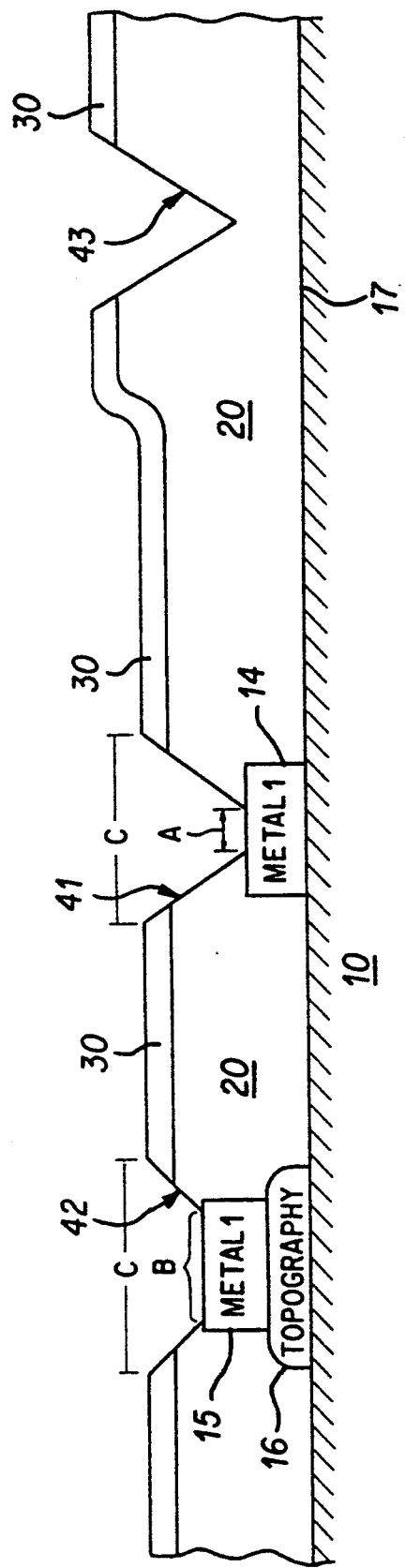
FIG. 1 is a cross-sectional view of a semiconductor wafer in which three vias have been etched using a conventional process.
Figure 2:
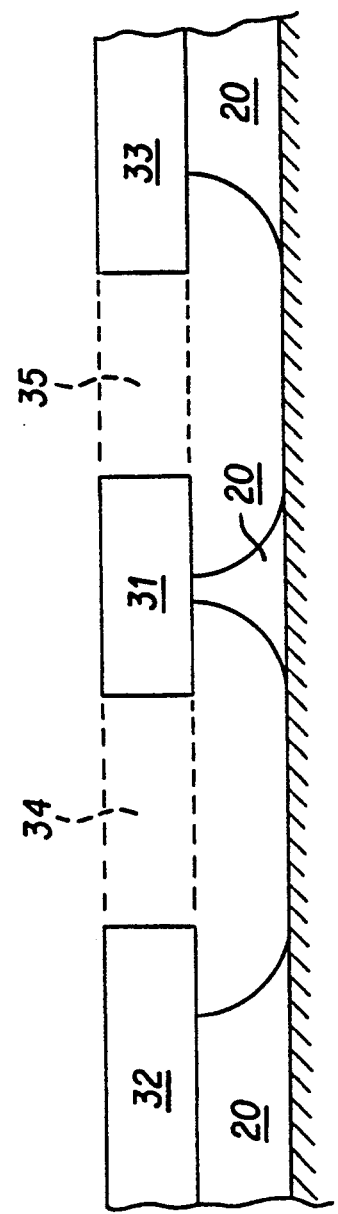
FIG. 2 is a cross-sectional view of a semiconductor wafer in which two vias have been etched using another conventional process.

The phrase "tapered via" is used throughout this disclosure (including in the claims) to denote a via whose bottom diameter (CD) is substantially less than its opening diameter. An example of a tapered via is a frusto-conical via, or a laterally elongated via having longitudinal axis parallel to the wafer surface and having the same sloping profile (i.e., projection in a plane perpendicular to the longitudinal axis) as does a frusto-conical via. Another example is a via having two or more cylindrical portions of different diameter, or an elongated via having longitudinal axis parallel to the wafer surface and having the same profile (i.e., projection in a plane perpendicular to the longitudinal axis) as does a via having two or more cylindrical portions of different diameter.

A preferred two-step embodiment of the inventive method will be described with reference to FIG. 3. Via 110 and via 111 are examples of completed vias produced by performing both steps of this preferred embodiment. The first step of this preferred embodiment is an anisotropic oxide plasma etch operation which produces a non-tapered via, such as via 112 of FIG. 3. The first step is preferably timed to have a normal duration sufficient to extend the via to a normal target depth (for example, 60% of the oxide layer thickness). Because the thickness of the resist and oxide layer above the target will typically vary across the wafer, it is desirable to monitor a characteristic of the via (such as the thickness of the material at the via's bottom) during or after performance of the first step. If the monitoring operation indicates that the first step has extended the via to the target, then the second step of this embodiment of the invention is commenced. However, if the monitoring operation indicates that the target (a deeper than normal target) has not been reached, then a control signal is generated for continuing the first step for a longer than normal duration (or a control signal is generated for repeating the first step) to reach the deeper than normal target.

Preferably, the plasma employed in the first step consists primarily of $CF_4$, rather than known etchants such as $CHF_3$, $C_2F_6$, or a $CHF_3/C_2F_6$ mixture. Although a $CHF_3/C_2F_6$ mixture has the advantage that its chemistry is "selective" to silicon (in the sense that it will erode a silicon embodiment of substrate 10 at much less rapid rate than it will erode oxide layer 20), we have found that use of such a $CHF_3/C_2F_6$ mixture will undesirably generate an oxide/polymer residue that will accumulate in the via during the first step of this embodiment. Such residue will mask the via sidewall during the second step of this inventive embodiment, thus inhibiting the second step. Since $CF_4$ is less prone to polymerizing reactions than are other etch chemicals, we prefer to employ a plasma consisting primarily of $CF_4$ in order to eliminate the problem of oxide/polymer residue accumulation. Where the via target is a metal portion (such as portion 101, 102, or 103) deposited on a silicon substrate, rather than at the substrate itself, use of $CF_4$ (which is not "selective" to silicon, in the sense that $CF_4$ will not erode oxide at a greater rate than it will erode silicon) is not a disadvantage since $CF_4$ will not erode the metal portion. However, where the via is intended to terminate directly at a silicon substrate, it may be preferable to employ an etching chemical (such as $CHF_3$, $C_2F_6$, or a $CHF_3/C_{26}$ mixture) which is "selective" to silicon, rather than a non-selective chemical such as $CF_4$, despite the resulting polymer residue accumulation problem. $CF_4$ is not only non-selective to silicon, but will in fact erode silicon at a greater rate than it will erode oxide. Thus, $CF_4$ will seldom be suitable as a via etching chemical where the via target is a silicon substrate.

The second step of the preferred embodiment is a resist erosion tapered plasma etch operation. An example of the resist and oxide layer material eroded when such a second step performed on via 112 is the material outlined by dashed line segments 113. In the second step, both the resist and the oxide layer are eroded in a controlled manner so as to produce a via having a sloping upper portion which traverses the resist and a portion of the oxide, and a non-tapered lower portion which traverses a portion of the oxide layer. The plasma used in the second step is a mixture of $O_2$ and $CF_4$. A mixture including $CF_4$ is used (rather than a mixture including some other fluorocarbon, such as $C_2F_6$) in order to eliminate the problem of polymer residue accumulation (which residue may inhibit efficient completion of the second step, or may inhibit a subsequent metal coating operation). We prefer that the $O_2:CF_4$ ratio should be equal to or greater than one, so that the resulting sloping via is free of polymer residue, regardless of the cleanliness of the etching equipment employed. In one preferred embodiment, we employ a "50%/50%" mixture including equal parts of $O_2$ and $CF_4$.

The slope of the upper sloping via portion is controllable by varying the ratio of oxygen to $CF_4$ employed in the second step. The depth to which the sloping portion extends is controlled by the duration of the second step.

The cross-sectional profile of a via produced in this preferred embodiment results in two advantages. First, the profile permits improved metal coverage of the via since more metal particles that are sputtered will arrive at the sloping sidewalls of the upper via portion than would arrive at vertical sidewalls of a non-tapered via such as via 112. In the latter case, the top of the non-tapered via would shadow the vertical sidewalls.

The second advantage is that the via's bottom diameter ("CD") will not significantly vary despite: (a) significant wafer nonuniformities as the via is etched across the wafer; and (b) substantial variations in the duration of the first and second steps as the via is etched. The duration of the first step may be varied to ensure that the non-tapered via produced during the first step will reach the desired targets. The targets typically will be metal portions such as portion 101, 102, or 103 in FIG. 3, whose depths below the surface of the resist will in general differ (for example, as metal portion 101 is at a different depth than is metal portion 102). This duration variation may be accomplished by continually monitoring a characteristic of the via (for example, the electrical resistance at its bottom) during the first step, and terminating the first step when the measured characteristic attains a predetermined value. Despite variations in the first step duration, the diameter of the non-tapered vias produced in the first step (and thus the bottom diameter of such vias) will be substantially uniform. This embodiment of the invention may accordingly be employed to produce vias having a broad range of aspect ratios, yet having uniform bottom diameter.

Figure 3:
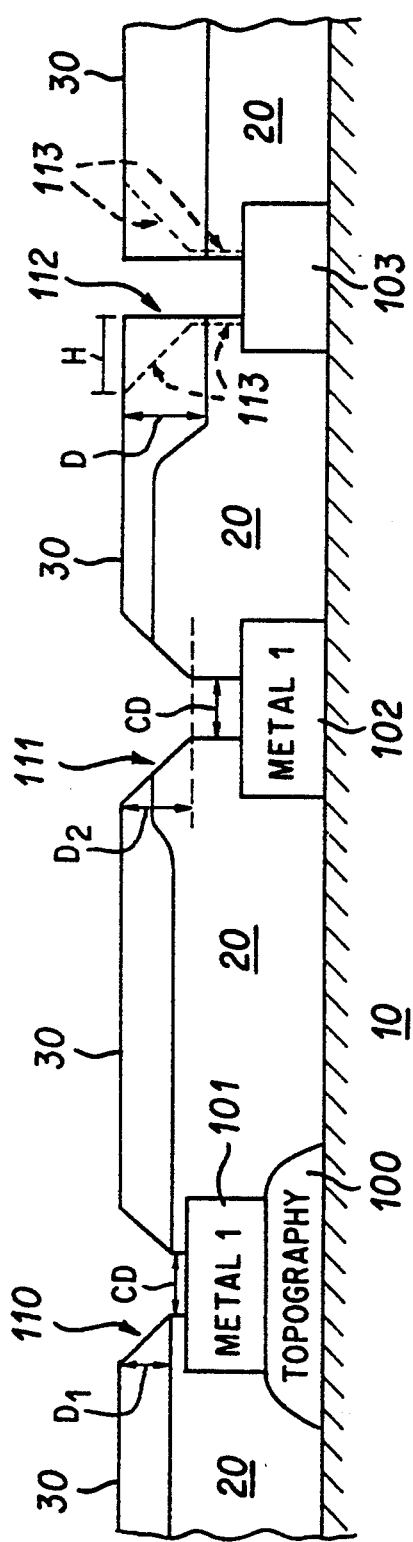
FIG. 3 is a cross-sectional view of a semiconductor wafer embodying the invention in which two complete vias have been etched using a preferred embodiment of the inventive method, and in which a partially completed via has been etched as the result of the first step of this preferred embodiment.

In the second step, the ratio of $O_2$ to $CF_4$ may be selected to achieve a desired "second step erosion region" slope (i.e., ratio of the depth D to the lateral (horizontal) extent H of the "second step erosion region" bounded by dashed lines 113 of FIG. 3), and the second step duration may be chosen to achieve a desired sloping region depth D. The second step may thus be controlled so that the bottom diameter of the via may be left substantially unchanged during the second step, over a wide range of possible combinations of depths (D) and slopes (D/H). For example, only a very thin layer of oxide 20 within dashed line 113 of FIG. 3 is removed from the vertical sidewalls of the lower portion of via 112 during the second step (so that the via's bottom diameter is not significantly changed during the second step), while a much greater volume of resist 30 is removed from the upper sidewalls of via 112 during the second step. Although via 110's target (metal portion 101) is shallower than is via 111's target (so that the first step of the etching operation producing via 110 likely had a longer duration than that producing via 111), and the depth $D_1$ of via 110's upper sloping portion is less than the depth $D_2$ of via 111's upper sloping portion, both via 110 and via 111 have substantially the same bottom diameter CD.

The preferred embodiment described above may be implemented using a conventional oxide etching device (such as a commercially available Model GCA 606 unit), or another conventional plasma etching device having two-step etch capability. Typical parameters employed when implementing this embodiment of the invention using a GCA 606 etching unit are as follows. The first step is performed using $CF_4$ at a gas flow rate of 100.00 Sccm, with a chamber pressure of 120 Mtorr; the second step is performed using equal parts of $O_2$ and $CF_4$, each at a gas flow rate of 50.00 Sccm, with a chamber pressure of 150 Mtorr. The first step is divided into a first substep (10 seconds in duration) in which the RF power for the unit is switched off, and a second substep (18 seconds in duration) in which the RF power supplied to the plasma is 430 watts. The second step is divided into a first substep (10 seconds in duration) in which the RF power for the unit is switched off, and a second substep (48 seconds in duration) in which the RF power supplied to the plasma is 360 watts.

Figure 4:
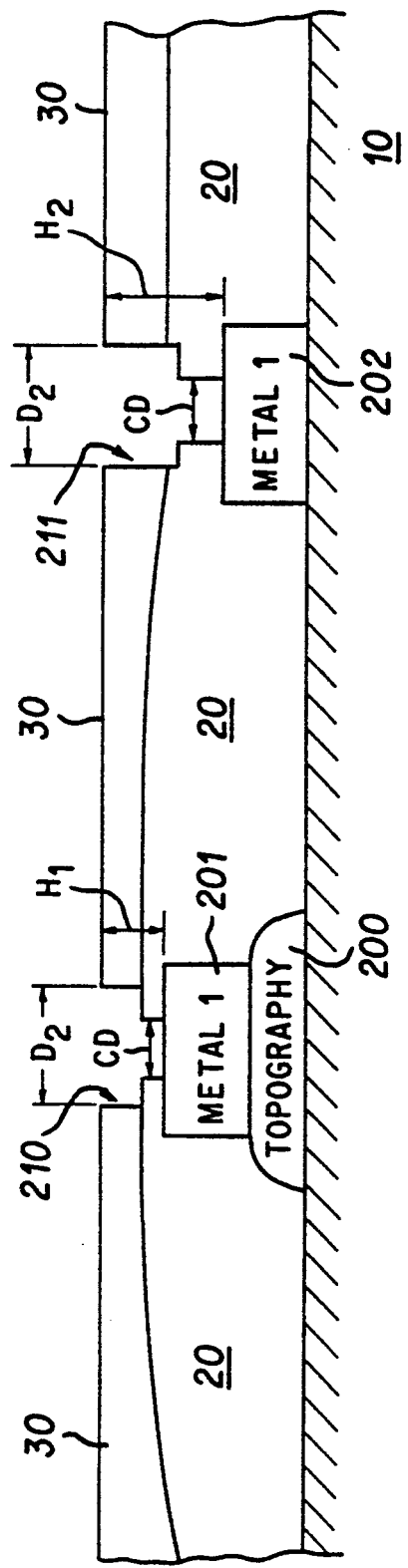
FIG. 4 is a cross-sectional view of a semiconductor wafer embodying the invention in which two complete vias have been etched using an alternative embodiment of the invention.

An alternative three-step embodiment of the inventive method will be described with reference to FIGS. 4 and 5. Vias 210 and 211 of FIG. 4 are typical stepped vias of the type that may be produced by this embodiment of the invention. Vias 210 and 211 each have the same bottom diameter CD and opening diameter D', although they extend to targets 201 and 202 located at different depths $H_1$ and $H_2$ below the upper surface of resist 30. Thus, stepped vias of the type shown in FIG. 4 may be produced so as to have a broad range of aspect ratios, with a uniform bottom diameter. Because each of vias 210 and 211 is tapered (i.e., has an opening diameter substantially larger than its bottom diameter), more complete metal coverage (better than 50% coverage) can be achieved using such vias than could be achieved using non-tapered vias having the same bottom diameter. However, the metal coverage attainable with vias 210 and 211 is generally not as complete can be attained with the tapered vias (such as vias 110 and 111) produced in the preferred embodiment of the invention, because each of vias 210 and 211 has vertical sidewalls separated by a substantially horizontal "step" or "shoulder" at the interface between resist 30 and oxide layer 20.

Figure 5:
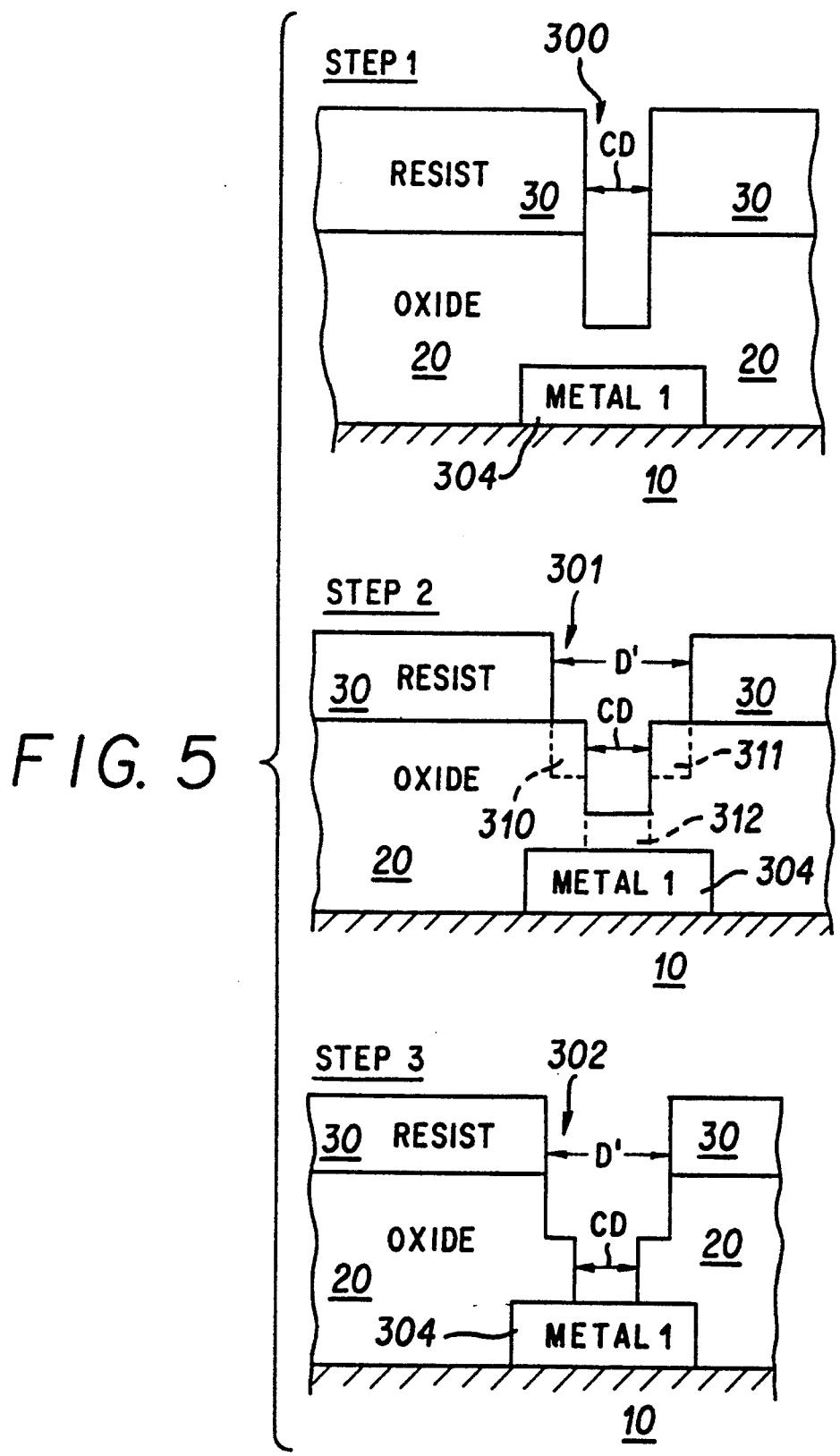
FIG. 5 is a sequence of three cross-sectional views of a semiconductor wafer showing the same via in different stages of completion during processing in accordance with the FIG. 4 embodiment.

FIG. 5 shows a typical via produced in accordance with the three-step alternative embodiment of the invention, as the via appears after each of the three steps of this embodiment of the invention. The first step of this embodiment is an anisotropic oxide plasma etch operation which produces non-tapered via 300, which extends through resist 30 into oxide layer 20. Preferably, the plasma employed in this operation consists primarily of $CF_4$, although it may alternatively consist primarily of a fluorinated hydrocarbon such as $CHF_3$, $C_2F_6$, or a $CHF_3/C_2F_6$ mixture.

The first step is preferably timed to have a normal duration sufficient to extend the non-tapered via to a normal target depth or to a selected distance above a normal target (for example, 70% of the oxide layer thickness). As in the embodiment described with reference to FIG. 3, because the thickness of the resist and oxide layer above the target will typically vary across the wafer, it is desirable to monitor a characteristic of the via during or after performance of the first step. If the monitoring operation indicates that the first step has extended the non-tapered via to the target (or to the desired distance above the target), then the second step of this embodiment of the invention is commenced. However, if the monitoring operation indicates that the target (or desired position above the target) has not been reached, then a control signal is generated for continuing the first step for a longer than normal duration (or a control signal is generated for repeating the first step).

As in the FIG. 3 embodiment, where the target is a region of a silicon substrate (rather than a metal layer deposited on the substrate), it is desirable to use an etching chemical (such as $CHF_3$, $C_2F_6$, or a $CHF_3/C_2F_6$ mixture) which is selective to silicon. Otherwise, it is preferable to eliminate polymer residue accumulation in the via by employing $CF_4$ as the etching chemical, as in the FIG. 3 embodiment.

The second step of this embodiment is an isotropic resist plasma etch operation to erode the resist surrounding the upper portion of the via, but not to significantly erode the oxide surrounding the lower portion of the via. Preferably, the plasma employed in this second step consists primarily of $O_2$. The result of the second step is thus to form a stepped via (such as via 301 of FIG. 5) having an upper non-tapered portion (having larger diameter D') extending through resist 30, and a lower non-tapered portion (having smaller diameter CD) extending into oxide layer 20. The second step does not significantly extend the total depth of the via.

The third step of this embodiment is another anisotropic oxide plasma etch operation which produces non-tapered via 302, which extends through resist 30 into oxide layer 20 to reach target 304. The plasma employed in this operation consists primarily of $CF_4$. As this plasma etch operation is anisotropic, it will remove oxide volumes 310, 311, and 312 at a relatively high vertical erosion rate. However, since the operation's lateral (horizontal) erosion rate is very small relative to its vertical erosion rate, it will not significantly increase the via's bottom diameter (CD). The third step is preferably timed to have a normal duration sufficient to extend the non-tapered via to a normal target depth. As described with reference to the first step, a monitoring operation may be performed to ensure that the third step is continued sufficiently long so that the via actually reaches the intended target.

It is well known how to select a relatively high gas flow rate and low pressure to achieve such anisotropic erosion during the third step (and the first step). It is also well known how to select a relatively low gas flow rate and high pressure to achieve isotropic erosion during the second step.

It will be apparent to those of ordinary skill in the art how to modify the three-step process described with reference to FIGS. 4 and 5 to etch a multi-stepped via through a multi-layer coating including more than two layers. In general, for each additional layer below the uppermost two layers, it would be necessary to perform an additional isotropic etch operation (analogous to the second step of the FIG. 5 embodiment) using an etch chemical selective to the layer immediately above such additional layer, and then an additional anisotropic etch operation (analogous to the third step of the FIG. 5 embodiment) using an etch chemical selective to such additional layer.

The embodiment described above with reference to FIG. 5 may be implemented using a conventional oxide etching device (such as a commercially available Model GCA 606 unit), or another conventional plasma etching device having three-step etch capability.

The invention also includes a coated semiconductor substrate of the type shown in FIGS. 3 and 4, whose coating has been etched in accordance with any embodiment of the inventive method.

The above description is merely illustrative of the present invention. Various changes in shapes, sizes, materials, time intervals, and other details of method and construction may be within the scope of the invention as defined by the appended claims.

What is claimed is:

1. A coated semiconductor substrate, including:
   a semiconductor substrate; and
   a plasma etched coating, including an oxide layer coated on the semiconductor substrate and a resist coated on the oxide layer, where the coating has ben plasma etched with a plasma comprising $CF_4$ to define a tapered via which extends through the resist, said via having a non-tapered bottom portion with a bottom diameter and an upper portion having a sloping profile and an opening diameter substantially larger than the bottom diameter, wherein the upper portion of the via extends through the resist, and the lower portion extends through a portion of the oxide layer.

* * * * *